United States Patent [19]

Tepman

[11] Patent Number: 5,919,345
[45] Date of Patent: **\*Jul. 6, 1999**

[54] UNIFORM FILM THICKNESS DEPOSITION OF SPUTTERED MATERIALS

[75] Inventor: Avi Tepman, Cupertino, Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/645,783

[22] Filed: May 14, 1996

Related U.S. Application Data

[63] Continuation of application No. 08/313,649, Sep. 27, 1994, abandoned.

[51] Int. Cl.⁶ .................................................. C23C 14/34
[52] U.S. Cl. ........................................................ 204/298.2
[58] Field of Search ........................ 204/298.12, 298.15, 204/298.16, 298.17, 298.18, 298.19, 298.2, 192.12

[56] References Cited

U.S. PATENT DOCUMENTS

| | | | |
|---|---|---|---|
| 3,654,110 | 4/1972 | Kraus | 204/298.06 |
| 3,988,232 | 10/1976 | Wasa et al. | 204/298.16 |
| 4,394,236 | 7/1983 | Robinson | 204/298.22 |
| 4,414,086 | 11/1983 | Lamont, Jr. | 204/298.18 |
| 4,457,825 | 7/1984 | Lamont, Jr. | 204/298.18 |
| 4,547,279 | 10/1985 | Kiyota et al. | 204/298.18 |
| 4,622,121 | 11/1986 | Wegmann et al. | 204/298.2 |
| 4,673,480 | 6/1987 | Lamont, Jr. | 204/298.18 |
| 4,721,553 | 1/1988 | Saito et al. | 204/192.12 |
| 4,747,926 | 5/1988 | Shimizu et al. | 204/192.12 |
| 4,756,810 | 7/1988 | Lamont, Jr. et al. | 204/192.3 |
| 4,957,605 | 9/1990 | Hurwitt et al. | 204/192.12 |
| 5,194,131 | 3/1993 | Anderson | 204/298.18 |
| 5,252,194 | 10/1993 | Demaray et al. | 204/298.2 |
| 5,320,728 | 6/1994 | Tepman | 204/298.2 |
| 5,490,913 | 2/1996 | Schertler et al. | 204/298.2 |
| 5,556,525 | 9/1996 | Krivokapic et al. | 204/192.12 |

FOREIGN PATENT DOCUMENTS

| | | | |
|---|---|---|---|
| 0 273 550 | 7/1988 | European Pat. Off. . | |
| 150 482 | 9/1981 | Germany | 204/298.19 |
| 150482 | 9/1981 | Germany | 204/298.19 |
| 59-229480 | 12/1984 | Japan | 204/298.12 |
| 62-017175 | 1/1987 | Japan . | |
| A 62-17125 | 1/1987 | Japan . | |
| 63-243272 | 10/1988 | Japan | 204/298.2 |
| 5-29257 | 2/1993 | Japan . | |
| 5-148633 | 6/1993 | Japan . | |
| 166346 | 6/1995 | Japan . | |

*Primary Examiner*—Nam Nguyen
*Assistant Examiner*—Rodney G. McDonald
*Attorney, Agent, or Firm*—Patterson & Associates

[57] ABSTRACT

A sputtering chamber includes a substrate support member, for positioning a substrate thereon, and a sputtering target therein. At least a portion of the sputtering surface of the target is located non-parallel to the substrate. In one aspect of the invention, the sputtering surface of the target is conical, and it tapers as it approaches the substrate.

34 Claims, 4 Drawing Sheets

UNIFORM FILM THICKNESS DEPOSITION OF SPUTTERED MATERIALS

This is a continuation of application Ser. No. 08/313,649 filed on Sep. 27, 1994 now abandoned.

BACKGROUND OF THE INVENTION

1. Field of the Invention

The present invention relates to methods and apparatuses for fabricating semiconductor devices on substrates, including semiconductor wafers. More particularly, the present invention relates to the formation of film layers on substrates by sputtering, wherein holes and/or trenches in the uppermost film layers must be uniformly, conformally filled.

2. Background of the Art

Sputtering is one well known method of depositing a film on a semiconductor substrate. A typical sputtering apparatus includes a target and a substrate support pedestal enclosed in a vacuum chamber. The target is typically affixed to the opposite wall from the substrate of the chamber, but is electrically isolated from the chamber walls. A voltage source maintains the target at a negative voltage with respect to the walls of the chamber, to convert a gas, maintained in the chamber at a low pressure, into a plasma. Ions from this plasma sputter the target. As target particles are sputtered from any point on the target, their trajectories theoretically have a cosine angular distribution; that is, the density of sputtered particles ejected from a point on the target along a trajectory having a given angle from perpendicular to the target is proportional to the cosine of such angle. Where the distance between the target and the substrate is less that the mean free path between collisions of atoms in the chamber, the target particles sputtered from the target generally travel in a straight line path and will tend to deposit on any surface which they contact.

One application of sputtering is to provide a continuous conformal metal film layer on the surfaces of holes and trenches extending through one or more pre-existing metal, dielectric or semiconducting film layers on the uppermost surface of the substrate. Each of the holes or trenches will typically include a base located substantially parallel to, and inwardly of, the uppermost film layer surface on the substrate, and a wall extending from the base to the exposed surface of the uppermost film layer.

One use of a conformal film layer is as a diffusion barrier at the base of the holes or trenches. For example, aluminum cannot be deposited directly on a silicon layer, because the aluminum will diffuse into the silicon and alter its properties. However, the low cost and high workability and conductivity of aluminum often dictate its use in semiconductor devices. Therefore, where aluminum is used to form a contact with a silicon layer, a barrier material such as titanium nitride is first deposited over the silicon.

To ensure that each of the contacts or vias formed with the metal layer have the same electrical properties, the thickness of the metal film layer deposited on the base of any of the holes or trenches should be the same thickness as the thickness of the metal film layer formed on the base of every other hole or trench, and the thickness of the metal film layer deposited on the wall of any of the holes or trenches should be the same thickness as the thickness of the metal film layer formed on the wall of every other hole or trench. Further, the film layer deposited on the wall of each of the holes should be symmetric, and the film layer should also have a relatively uniform thickness over the entire span of the wall or base of each hole or trench. However, the film layer formed on the base of the hole may be of a different thickness than the film layer formed on the wall of the hole.

The uniformity of the film layer deposited on the wall and base of each hole or trench is dependant on the distribution of the individual particles of target material reaching each of the holes or trenches. Particles travelling in paths which are substantially perpendicular to the substrate surface will pass through the open end of the hole or trench and deposit on the hole or trench base. Particles travelling at angles from perpendicular to the substrate surface will typically deposit on the hole wall and the intersection of the hole wall and base. However, particles that are travelling in paths at a substantial angle with respect to perpendicular from the substrate, or, in other words, are travelling in paths at low angles with respect to the substrate surface, may only reach the top most portion of the wall because the surface of the substrate at the hole opening shadows the base and lower portions of the wall from these particles.

Where a hole is deep with respect to the hole width, the target material which would commonly reach the lower reaches of the wall, or the intersection of the base and wall, is shadowed by the adjacent surface of the substrate. The blocked material deposits on the uppermost surface of the substrate adjacent to the hole opening, and this deposit can further block access of the target material to the lower reaches of the wall and the intersection of the base and the wall. The resulting film layer in the hole will be thickest at the center of the base and at the outermost areas of the wall but thin at the intersection of the base and the wall, leaving a less-filled region within the hole. Further, the deposit at the hole or trench opening will tend to restrict the hole opening, or it may actually form a bridge across the hole or trench opening to create an encapsulated void in the hole.

Optimally, the quantity of target material reaching each location on the hole base is equal so that a uniform thickness, conformal film layer will be formed over the base. Likewise, the quantity of material reaching each location on the wall is optimally equal, so that a symmetric, uniform thickness film layer is formed on the wall and no notches should be present where the wall and base layers meet. However, where the film layer is used as a diffusion barrier to prevent diffusion between a second film layer and the material at the base of the hole, the thickness at the base of the hole is the critical material thickness, and the wall coverage may be minimal.

The geometry of the holes and trenches, in combination with the distribution of the paths in which material sputtered from the target travel, prevents uniform conformal filling of the holes. As a first order approximation, the density of target particles travelling in a path at an angle to perpendicular to the target is proportional to the cosine of that angle. However, in reality the distribution of particles sputtered from each point on the target is not cosine angular but instead more complex, and is dependent on the type of target material being sputtered.

For example, where aluminum or aluminum alloy targets are sputtered, as an approximation, the distribution of target particle trajectories is proportional to the cosine of the angle formed between the target particle trajectory and any ray, or line, extending from the sputtered location at an angle of approximately 30° to 40° from perpendicular to the sputtering target surface. The resulting distribution of target particle trajectories is generally conical, wherein the greatest percentage of particles sputtered from the target travel away from the target in a conical distribution centered about a conical reference surface located at about 30° to 40° from the reference line perpendicular to the target. Thus, where aluminum is sputtered from a flat target, the majority of the target material travels in paths which are oblique, (i.e., substantially non-perpendicular) to the surface of the target.

Therefore, there exists a need in the art for a sputtering apparatus which provides a uniform film layer, while enabling void free, uniform, conformal covering of holes or trenches in the upper surface of the substrate.

SUMMARY OF THE INVENTION

The present invention provides methods and apparatus for the deposition of useful film layers on substrates by sputtering, wherein a sputtering target is exposed to a plasma, and ions from the plasma bombard the target to sputter material from the target and thus provide a flux of target material for deposition on the substrate. At least a portion of the sputtering surface of the target is askew, i.e., non-parallel to, the surface of the substrate.

In one aspect of the invention, the target is provided with a convex sputtering surface. The convex profile of the sputtering surface is preferably at least partially conical, but other geometries, such as semi-spherical or hemispherical, are specifically contemplated. The convex surface assures that at least a portion of the sputtering surface of the target is askew to the deposition receiving surface of the substrate. Preferably, the sputtering surface of the target is disposed at an angle, with respect to the deposition receiving surface of the substrate, that is equal to the angle between the peak of the distribution of sputtered material and a reference line perpendicular to the target. This positioning of the sputtering surface of the target assures that a substantial portion of the target material flux reaching the substrate is travelling perpendicular to the substrate, and the portion of the flux travelling most obliquely with respect to the top-most, deposition receiving surfaces of the substrate misses the surface of the substrate altogether. Thus, the holes or trenches in the uppermost surface of the substrate will be more uniformly conformally covered.

In a further aspect of the invention, the non-planar sputtering surface of the target is a concave conical surface. A portion of the target material sputtered from the target will deposit directly on the substrate in this configuration, and another portion of the material will be directly deposited on adjacent regions of the target. The redepositing portion of the target material flux may be re-sputtered from the target for deposition on the substrate, to advantageously increase the material usage from the target.

DESCRIPTION OF THE PREFERRED EMBODIMENTS

The sputtering apparatus and technique of the present invention generally contemplates the positioning of a sputtering target in a chamber, and then sputtering material from an exposed sputtering surface of the target and depositing a portion of that material on a substrate. The sputtering surface of the target is disposed at least partially obliquely, or non-parallel, to the uppermost surface of the substrate. This oblique sputtering surface is positioned to provide a high density of target material travelling in trajectories which are perpendicular to the substrate without the necessity of a physical collimation device. The deposition layer formed on the substrate, and on the base and wall regions of the holes in the uppermost surface thereof, will be relatively uniform and continuous within each hole in the uppermost surface of the substrate, and the thickness of the film layer formed on the hole base and wall will be substantially equal in each of the holes in the uppermost surface of the substrate.

Figure 1:
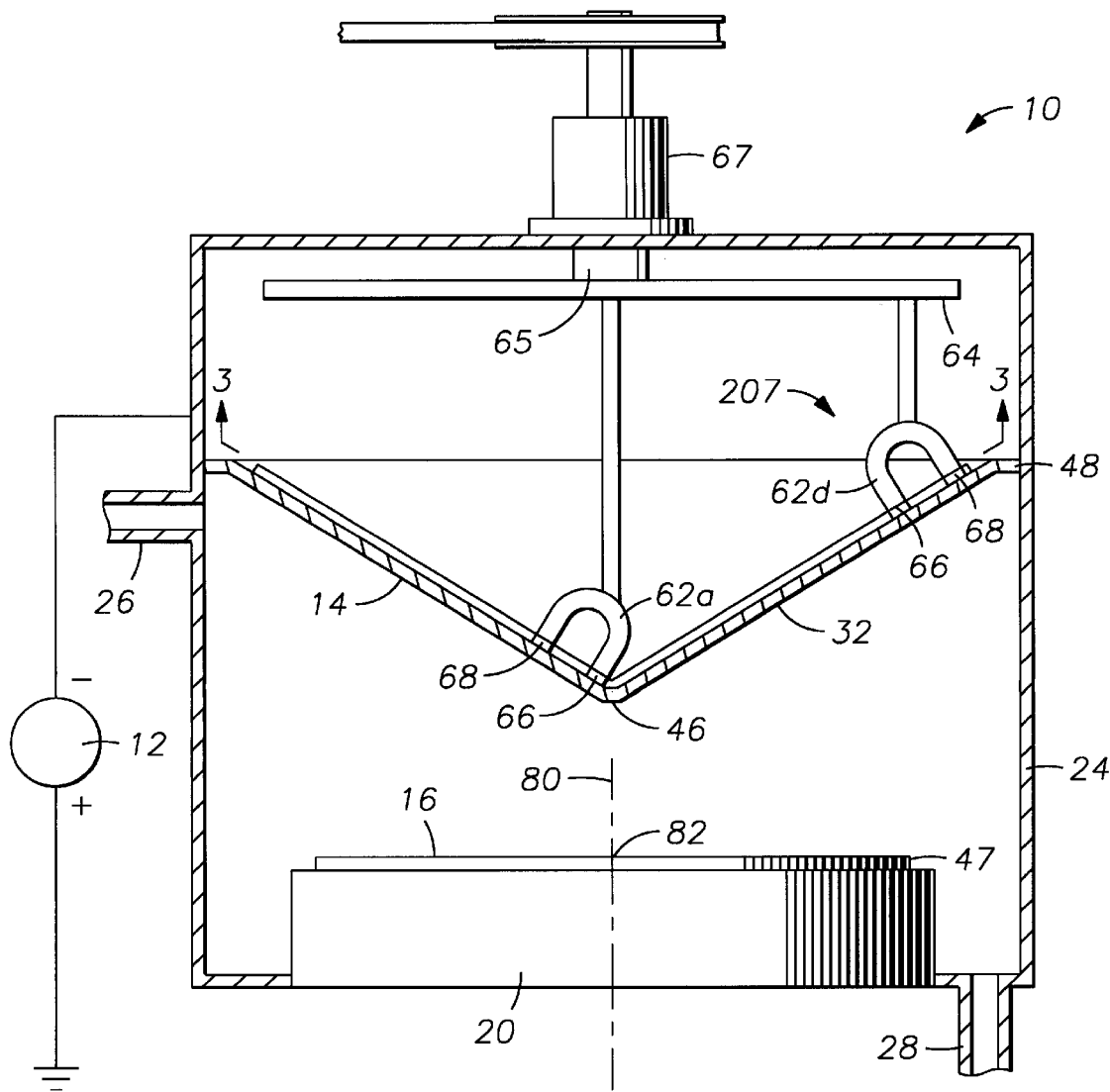
FIG. 1 is a sectional view of a sputtering chamber having the preferred embodiment of the target received therein.

Referring to FIG. 1, in the preferred embodiment of the invention, the oblique sputtering surface is provided by positioning a non-planar sputtering target 14 in a conventional vacuum chamber 10, wherein a substrate 16 is received in the chamber 10 and positioned on a support member, such as a pedestal 20, for deposition of a sputtered material layer thereon. The pedestal 20 includes a generally planar surface for receiving the substrate 16 thereon, so that the upper surface of the substrate 16 is generally parallel to the planar surface of the pedestal 20. The material layer may, if desired, be formed over one or more dielectric, metal or other layers previously formed on the substrate 16, and may fill holes in the dielectric or other layer to form a via or contact. Although the description of the hole filling improvements of the present invention are described in terms of hole filling, the invention is equally applicable to the filling of trenches and other substrate aperture geometries.

The conventional vacuum chamber 10 generally includes a chamber enclosure wall 24, having at least one gas inlet 26 and an exhaust outlet 28 connected to an exhaust pump (not shown). The substrate support pedestal 20 is disposed at the lower end of the chamber 10, and the target 14 is received at the upper end of the chamber 10. The target 14 is electrically isolated from the enclosure wall 24 and the enclosure wall 24 is preferably grounded, so that a negative voltage may be maintained on the target 14 with respect to the grounded enclosure wall 24. To form the deposition material layer on the substrate 16 in the chamber 10, the substrate 16 is first passed through a load lock (not shown) in the enclosure wall 24, and positioned within the chamber 10 by a robot arm, blade or other device to be received on the support pedestal 20.

During the deposition process a gas such as Ar is charged into the vacuum chamber 10 through the gas inlet 26 at a selected flow rate regulated by a mass flow controller.

A D.C. power supply 12 applies a negative voltage to the target 14 with respect to the enclosure wall 24 so as to excite the gas into a plasma state. Ions from the plasma bombard the target 14 and sputter atoms and other particles of target material from the target 14.

Figure 2:
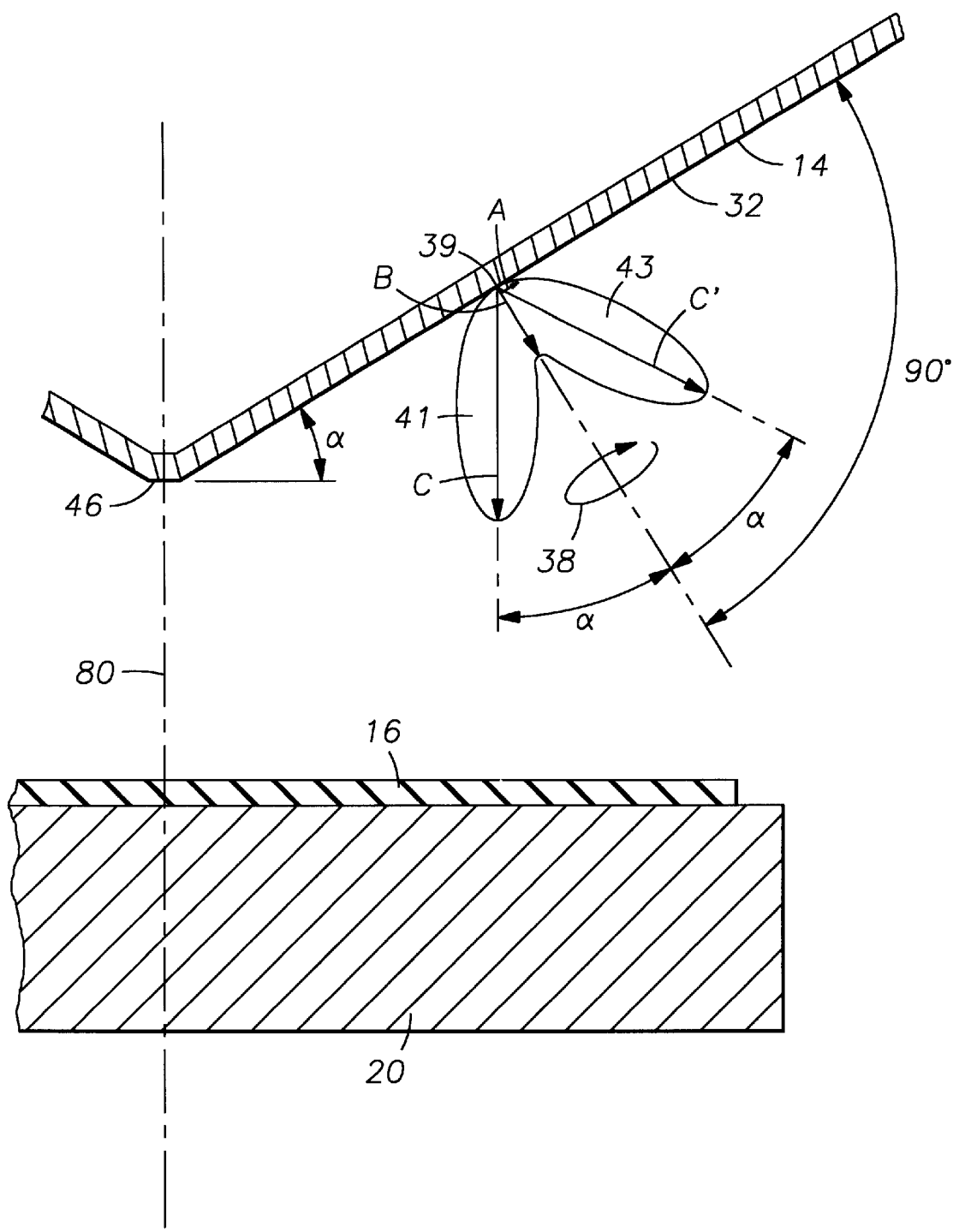
FIG. 2 is a partial enlarged view of the chamber of FIG. 1, showing the relationship between the distribution of the trajectories of the target material and the substrate position.

Referring now to FIG. 2, the distribution 41 of trajectories of the target material sputtered from each location of the target 14 is shown, wherein the target 14 is an aluminum or aluminum alloy target. The distribution pattern 41 shown in FIG. 2 is a sectional view of the distribution target particles, it being understood that the full distribution is defined by rotating the pattern 41 180° about the reference line 38. The distribution pattern includes a defining envelope 43. The probability of a target particle travelling in any path from the point 39 on the sputtering surface 32 of the target 14 is proportional to the distance between that point 39 and the location where the trajectory passes through the envelope 43.

As one or more plasma ions bombard the sputtering surface 40 of the target 14, they will free an atom, or a larger particle, of target material from the sputtering surface 32 of the target 14. The particles sputtered from the target 14 tend to travel from the sputtering surface 34 of the target 14 in linear trajectories and deposit on any surface they contact, including the upper surface of the substrate 16. The trajectories of the particles are predictable. For an aluminum or aluminum alloy target 14, the particles will travel in trajectories symmetrically distributed over 360° about a reference line 38 extending through the source location and perpendicular to the sputtering surface 32 of the target 14 and at an angle ranging from approximately 0°, as shown by vector A of FIG. 2, to an angle as great as 90°, as shown by Vector B of FIG. 2, from the reference line 38. However, most of the target particles will travel in paths ranging from 25° to 55° from the reference line 38 perpendicular to the sputtering surface 32. The 25° to 55° range of sputter particle trajectories is centered around a peak in the distribution which is typically located at approximately 30° to 40° from the reference line 38, as shown by vector C in FIG. 2. The probability that a particle will travel in any trajectory relative to the vector C is approximately proportional to the cosine of the angle between that trajectory and the vector C, wherein the target particle may also travel, with equal probability, at that angle from the vector C anywhere within a 360° arc about the reference line 38. Therefore, the distribution of the target material trajectories may be considered conical.

If the sputtering surface of a planar aluminum target is located parallel to the substrate 16, most of the target material sputtered from the target 14 will be travelling in trajectories which are oblique to the substrate 16, and will tend to deposit non-uniform or asymmetric film layers on the base and wall of the holes (not shown) in the uppermost surface of the substrate 16. The configuration of the target 14 of the present invention substantially mitigates this phenomenon, by arranging the sputtering surface 40 of the target 14 askew, or oblique, to the uppermost surface of the substrate 16 as shown in FIGS. 1 and 2, such that a portion of the non-uniform distribution 41 of target material sputtered from the target 14 travels in a trajectory which is substantially perpendicular to the substrate 16, and the portion of the target material travelling most obliquely to the sputtering surface 38 is directed to the side wall of the chamber 10. For an aluminum target having the sputtering trajectory probability distribution of 41 shown in FIG. 2, the sputtering surface 32 of the target 14 is disposed at an angle α with respect to the planar deposition receiving surface of the substrate 16, wherein the angle α is equal to the angle between the peak probability in the distribution 41 (as shown by vector C) and a reference line 38 perpendicular to the target sputtering surface 32. Therefore, a relatively large quantity of target material travelling in a trajectory perpendicular to the substrate will be deposited on the substrate 16.

Referring again to FIG. 1, the preferred orientation of the target 14 is shown. Preferably, the target 14 is configured with a conical sputtering surface 32, which terminates inwardly of the chamber in a generally circular face 46. The face 46 has a minimal surface area, which is necessary to avoid having a point at the inner end of the target 14. The face 46 is spaced from the substrate 16 by a distance sufficient to prevent arcing between the high voltage sputtering surface 32 of the target 14 and the grounded substrate support member 20, and to ensure that particles sputtered from the target 14 adjacent to the intersection of the conical sputtering surface 32 and the base 46, which are travelling substantially transverse to the substrate 16, do not deposit on the substrate 16 but instead pass over the substrate and deposit on the chamber walls. Further, the outer, upper edge 48 of the target 14 is sized to extend the sputtering surface 32 of the target 14 slightly outwardly, in a radial direction, from the edge 47 of a substrate 16 received on the support member 20. The sputtering surface 32 is preferably a frustoconical surface, wherein the surface is disposed symmetrically about a reference line 80 perpendicular to, and passing through the approximate center 82 of the substrate 16.

By tilting the surface of the sputtering target 14 with respect to the top-most, deposition receiving surface of the substrate 16, one of the vectors C of peak distribution probability may be positioned substantially perpendicular to the surface of the substrate 16, and the vector C', representing the peak trajectory of particles most transverse to the upper surface of the target 14, is nearly parallel to the surface of the substrate 16. Therefore, the tilted surface of the target 14 directs a portion of the otherwise transversely travelling target material flux to the chamber wall, while it simultaneously directs a portion of the otherwise transversely travelling target particle trajectories nearly perpendicular to the substrate. The enhancement of the perpendicular portion of the target particle trajectories, coincident with the translation of the most transverse trajectories to more transverse trajectories, enables hole filling with reduced overhang and enhanced base and wall coverage.

By extending the tilted surface of the target over nearly the entire surface of the substrate, all regions of the substrate 16 receive deposition particles travelling in paths which are perpendicular to the substrate surface which also correspond to a path travelling through the peak probability of the distribution.

To enable meaningful throughput of substrates 16 through the chamber 10, the sputtering of the target 14 surfaces must be enhanced, such as by providing a magnetron apparatus to form an electron trapping magnetic field adjacent to the surface of the target 14. The electron trapping magnetic field will produce a high flux of electrons travelling parallel to the immediate surface of the target 14, and thus create a large quantity of ions for bombardment of the target 14.

Figure 3:
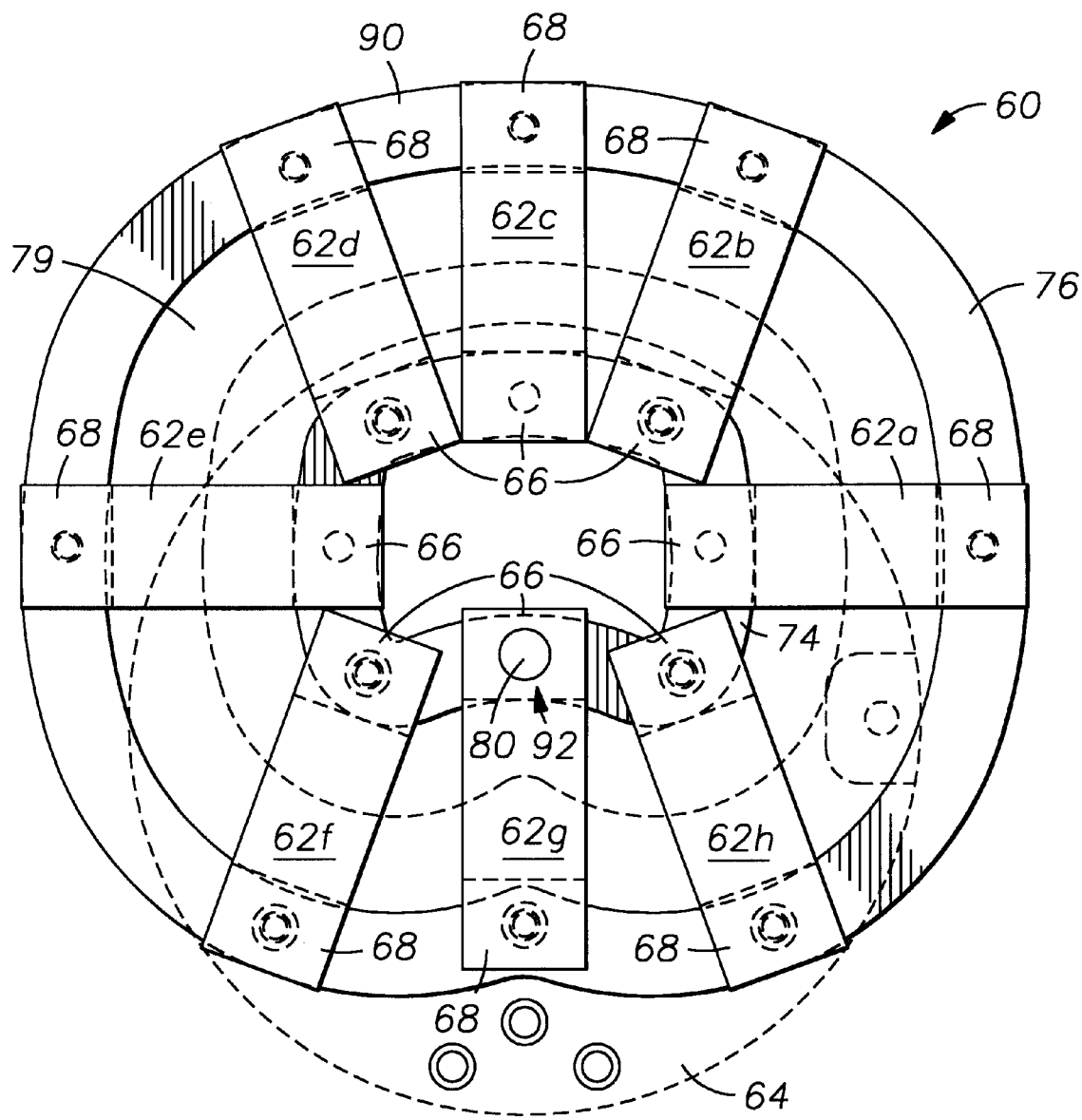
FIG. 3 is a view of the magnetron apparatus of FIG. 1 at 3—3.

Referring now to FIGS. 1 and 3, the preferred structure of a magnetron apparatus 60 to provide an electron trapping magnetic field is shown. The magnetron 60 includes a plurality of magnets 62a–f (only 62a and d shown in FIG. 1), each of which are connected to a rotating counterbalance plate 64 (best shown in FIG. 1), and each of which includes a north pole 66 and a south pole 68. As shown FIG. 1, the rotating plate 64 is connected to a drive shaft 65 extending through a sealed bearing connection 67. A rotary drive apparatus, such as a electric motor (not shown), is coupled to the drive shaft to provide rotation of the magnets 62a–g and the pole pieces 74, 76.

To provide the electron trapping arrangement with the magnets 62, the south poles 66 of each of the magnets 62 are connected to an inner pole piece 74, and the north poles 68 of each of the magnets 62 are connected to an outer pole piece 76. Each of the pole pieces 74, 76 are preferably annular, irregular, frustoconical, rings, separated by an annular gap 79. The magnets 62, and thus the pole pieces 76, 78, are rotated by the shaft 74 about the reference axis 70 passing through the center of the shaft 74 and about the center of the circular region 46 of the target 14.

Referring still to FIG. 2, the annular ring forming each of the pole pieces 76, 78 includes a generally semi-arcuate rectangular portion 90 and an inwardly projecting reverse radius portion 92 extending inwardly of one of the sides of the rectangular portion 90. The inwardly projecting radial portions 92 of each of the pole pieces 76, 78 are aligned. As a result of this pole piece 76, 78 geometry and spacing, an electron trap 94, as shown by the dashed reference line 94 in FIG. 2, is created in the gap 79 between the pole pieces 76, 78. The width of the gap 79 between the two pole pieces 76, 78 is relatively constant, so that the electron trapping properties in the gap 79 are substantially constant.

When the pole pieces 76, 78 are rotated about the reference line 80, the electron trap 94 is likewise rotated about the reference line 80. Because the electron trap 94 extends from nearly the center, to nearly the edge, of the target 14, a portion of the electron trap 94 will pass behind nearly all of the sputtering surface 42 of the target 14 as the magnetron apparatus is rotated about the reference line 80. Moreover, the irregular shape of the electron trap 94 is designed to ensure that an equal area of the electron trap 94 will pass behind each portion of the sputtering area of the target sputtering surface 42 over a given unit of time, thereby creating uniform, enhanced, sputtering of the target 14.

The geometry of the target 14, in conjunction with the uniform sputtering of the frustoconical sputtering surface 32, enables uniform thickness, conformal deposits in the holes (not shown) throughout the surface of the substrate 16. Uniformity is provided because a substantial portion of the material deposited at each location on the substrate is contributed by the region of the target directly above that location on the substrate.

Figure 4:
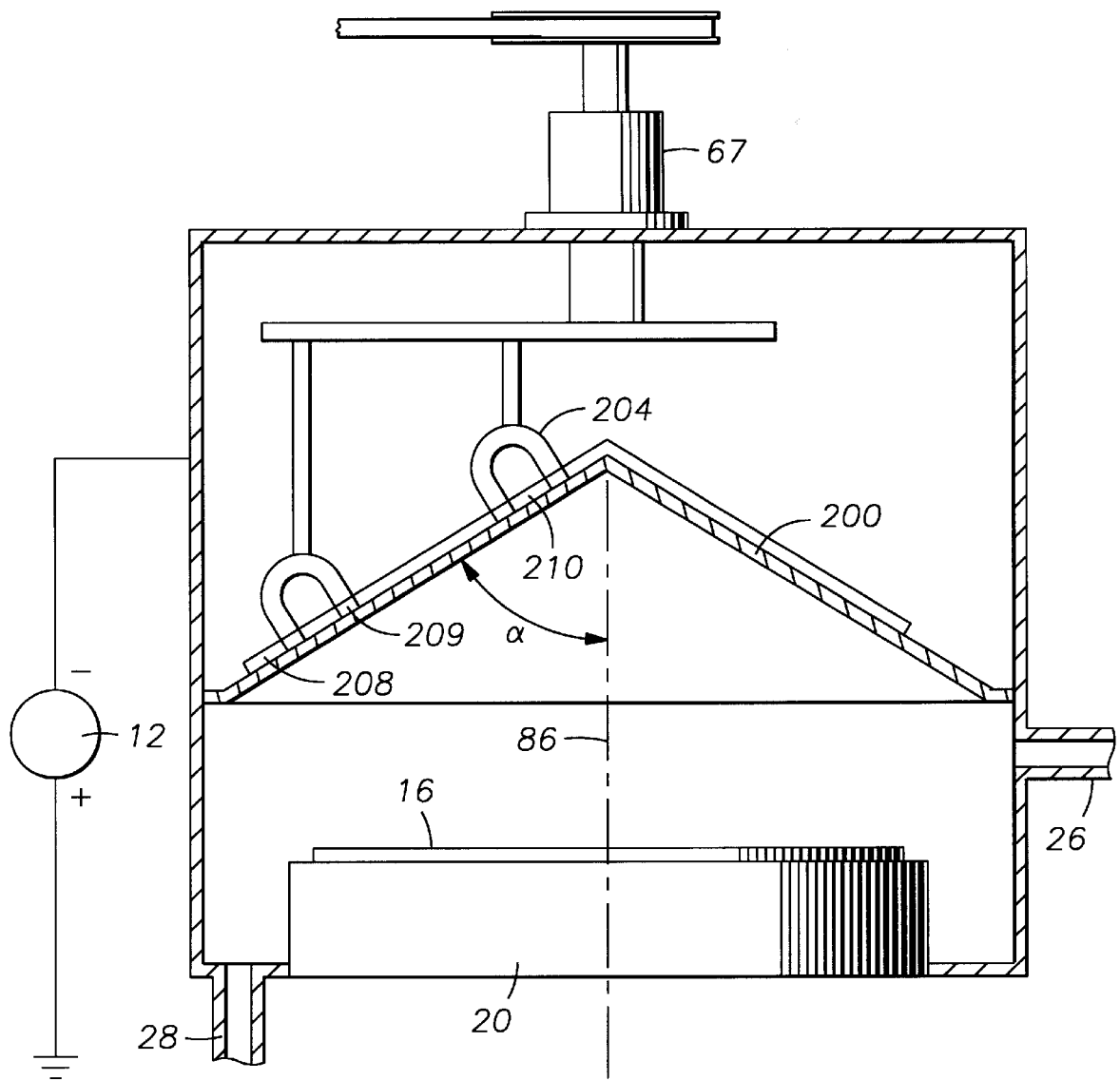
FIG. 4 is a sectional view of a sputtering chamber showing an alternative target profile.

Referring now to FIG. 4, an alternative embodiment of the invention is shown, wherein an alternative target 200, having a concave frustoconical sputtering surface 202, is provided. A magnetron apparatus 204, having a plurality of magnets 206 attached to a pair of pole pieces 208, 209 to create an electron trapping region 210, is located above the target 200. As with the convex target 14, the magnetron apparatus 204 rotates behind the target 200 to provide uniform enhanced sputtering of the sputtering surface 202. Additionally, as with the convex target 14, the cone angle, i.e., the angle between the sputtering surface 202 and a perpendicular reference line passing through the center of a substrate 16, is approximately 55°. As a result, a substantial portion of the frustoconical distribution 41 of the target material will travel in trajectories which are substantially perpendicular to the uppermost surface of the substrate 16 to enable uniform filling of holes in the uppermost layer on the substrate 16. Further, because the concave sputtering surface 202 of the target 200 extends over the entire surface of the substrate 16 a portion of the peak distribution may be directed toward each location on the substrate 16 to enable uniform hole filling. Additionally, most of the target material that is not directed toward the substrate 16 will deposit on the opposite side of concave target 200. This material will be then be re-sputtered for deposition on the substrate 16. By re-depositing a substantial quantity of the material sputtered from the target 200 which does not deposit on the substrate 16 back onto the target 200, the amount of target material wasted during processing is significantly reduced as compared to planar targets where a substantial quantity of the target material is deposited on the side walls, or shields, of the chamber 10. Therefore, the material usage from the concave profile target 200 is more efficient than that with the convex profile target.

Although the target profiles have been described herein in terms of conical profiles, i.e., where the shortest line between a point at the base of the target and a point at the top of the target is a straight line, other sputtering surface profiles are specifically contemplated by the invention. For example, the target may be conical, or frustoconical, but the sputtering surface may be bowed outwardly. Likewise, the target could be a truncated spherical shell, or could even have a non-uniform profile selected to provide a uniform deposition layer on the substrate for a given target material. Additionally, although the invention has been described herein in terms of an aluminum target, the invention may be used in conjunction with other target materials, such as titanium, wherein the peak in the sputtered particle distribution is not perpendicular to the planar surface of the target.

I claim:

1. An apparatus for sputtering a film layer onto a substrate, comprising:
   a vacuum enclosure having a sputtering target of generally uniform thickness and a pedestal disposed therein;
   said pedestal having a generally planar substrate receiving surface thereon;
   said target including a convex sputtering surface wherein a portion of sputtered material from the target leaves the target at an askew angle to the substrate receiving surface and is directed in a trajectory which is substantially perpendicular to the substrate receiving surface;
   at least a portion of said convex surface located askew to said generally planar substrate receiving surface of said pedestal; and
   a magnetron assembly located adjacent said target, at least a portion of said magnetron assembly being located askew to said substrate receiving surface.

2. The apparatus of claim 1, wherein said convex sputtering surface terminates adjacent said pedestal in a planar face.

3. The apparatus of claim 1, wherein said convex sputtering surface is symmetrically disposed about a reference line perpendicular to, and extending through the center of, said substrate receiving face.

4. The apparatus of claim 3, wherein said sputtering surface is disposed at an angle, with respect to the planar disposition receiving surface of the substrate, which is approximately equal to the angle between the peak in the distribution of target material sputtered from a point located on the target surface and a reference line perpendicular to the point located on the target surface.

5. The apparatus of claim 3, wherein the distance between said reference line and said convex sputtering surface decreases as the distance from the sputtering surface to the substrate decreases.

6. The apparatus of claim 1, wherein said sputtering surface, when exposed to a plasma, provides a flux of target particles inwardly of the chamber when exposed to a plasma; and
   the probability of a particle travelling in any trajectory from the point from which it is sputtered from the target is dependant on the cosine of the angle between that trajectory, and a reference line extending from that point on the target at an angle of 30° to 40° from a line perpendicular to the surface of the substrate.

7. The apparatus of claim 1, wherein said target is aluminum.

8. The apparatus of claim 1, wherein the material sputtered from said target has a conical distribution of trajectories, and said convex sputtering surface is located to direct a portion of said trajectories in said conical distribution substantially perpendicular to said substrate receiving surface of said pedestal and a portion of said trajectories in said conical distribution substantially parallel to said substrate receiving surface of said pedestal.

9. The apparatus of claim 1 wherein said convex sputtering surface is conical.

10. The apparatus of claim 9 wherein said conical sputtering surface terminates adjacent said pedestal in a planar face.

11. The apparatus of claim 1, wherein the magnetron assembly is positioned to provide a high density flux of ions which bombard the target normal to the sputtering surface.

12. An apparatus for sputtering a film layer onto a substrate, comprising:
   a) a vacuum enclosure having a non-planar sputtering target of generally uniform thickness and a pedestal therein;
   b) said pedestal having a generally planar substrate receiving surface thereon for supporting the substrate;
   c) said target including a convex sputtering surface wherein a portion of sputtered material from the target leaves the target at an askew angle to the substrate receiving surface and is directed in a trajectory which is substantially perpendicular to the substrate receiving surface;
   d) a magnetron apparatus located adjacent a non-sputtering surface of the target, at least a portion of said magnetron apparatus being located askew to said surface of said pedestal; and
   e) at least a portion of said convex surface located askew to said generally planar substrate receiving surface of said pedestal.

13. The apparatus of claim 12, wherein said convex sputtering surface terminates adjacent said pedestal in a planar face.

14. The apparatus of claim 12, wherein said convex sputtering surface is symmetrically disposed about a reference line perpendicular to, and extending through the center of, said substrate receiving surface.

15. The apparatus of claim 14, wherein said sputtering surface is disposed at an angle, with respect to the planar deposition receiving surface of the substrate, which is equal to the angle between the peak in the distribution of target material sputtered from a point located on the target surface and a reference line perpendicular to the point on the target surface.

16. The apparatus of claim 14, wherein the distance between said reference line and said convex sputtering surface decreases as the distance from the sputtering surface to the substrate decreases.

17. The apparatus of claim 16, wherein said sputtering surface provides a flux of target particles inwardly of the chamber when exposed to a plasma; and
   the probability of a particle traveling in any trajectory from the point from which it is sputtered from the target is dependent on the cosine of the angle between that trajectory, and a reference line extending from that point on the target at an angle of 30° to 40° from a line perpendicular to the surface of the substrate.

18. The apparatus of claim 12, wherein said target is aluminum.

19. The apparatus of claim 12, wherein the material sputtered from said target has a conical distribution of trajectories, and said convex sputtering surface is located to direct a portion of said trajectories in said conical distribution substantially perpendicular to said substrate receiving surface of said pedestal and a portion of said trajectories in said conical distribution substantially parallel to said substrate receiving surface of said pedestal.

20. An apparatus for sputtering a film layer onto a substrate, comprising;
   a vacuum enclosure having a convex sputtering target of generally uniform thickness and a pedestal therein;
   said pedestal having a generally planar substrate receiving surface thereon;
   said target having a first sputtering surface and a second non-sputtering surface, the non-sputtering surface being generally co-planar with said sputtering surface, wherein a portion of sputtered material from the target leaves the target at an askew angle to the substrate receiving surface and is directed in a trajectory which is substantially perpendicular to the substrate receiving surface;
   substantially all of said sputtering surface disposed above said substrate receiving surface is located askew to said generally planar substrate receiving surface of said pedestal; and
   a magnetron apparatus located adjacent said non-sputtering surface of said target, at least a portion of said magnetron apparatus being located askew to said surface of said pedestal.

21. An apparatus for sputtering a film layer onto a substrate, comprising:
   a vacuum enclosure having a convex sputtering target and a pedestal therein;
   a substrate receiving surface located on said pedestal for supporting the substrate;
   said target comprising a sputtering surface wherein a portion of sputtered material from the target leaves the target at an askew angle to the substrate receiving surface and is directed in a trajectory which is substantially perpendicular to the substrate receiving surface;
   substantially all of the sputtering surface of the target disposed above said substrate receiving surface is located askew to the substrate receiving surface of the pedestal; and
   a magnetron assembly located adjacent the target, the magnets of the magnetron assembly located askew to the surface of the pedestal.

22. An apparatus for sputtering a film onto a substrate, comprising:
   a vacuum enclosure having a sputtering target and a substrate support member therein;
   a substrate receiving surface located on the substrate support member;
   the target having a convex sputtering surface and a non-sputtering surface thereon;
   a magnetron assembly located adjacent the non-sputtering surface, at least a portion of the magnetron assembly being located askew to the surface of the substrate support member;
   wherein the distance between the sputtering surface and the substrate support member extends between a first and a second distance wherein a portion of sputtered material from the target leaves the target at an askew angle to the substrate receiving surface and is directed in a trajectory which is substantially perpendicular to the substrate receiving surface; and
   wherein the distance between the pole pieces of the magnetron assembly and the substrate support member is between said first distance and said second distance.

23. An apparatus for sputtering a film onto a substrate, comprising:
   a vacuum enclosure having at least a convex sputtering target having a hollow region and a pedestal therein having a substrate receiving surface, at least a portion of said target having a non-planar sputtering surface wherein a portion of sputtered material from the target leaves the target at an askew angle to the substrate receiving surface and is directed in a trajectory which is substantially perpendicular to the substrate receiving surface;

a magnet assembly located adjacent said target, at least a portion of said magnetron assembly being located askew to said surface of said pedestal and at least a portion of said magnet assembly is received in said hollow region of said target;

said pedestal positionable at a distance from said target to position a substrate for processing in said chamber;

wherein said non-planar portion of said target extends between a minimum distance and a maximum distance from said pedestal when said pedestal is positioned to process a substrate in said chamber; and wherein at least a portion of said magnet assembly is located between said maximum and said minimum distance from said pedestal when said pedestal is positioned to process a substrate in said chamber.

24. A sputtering apparatus comprising a vacuum chamber, a pedestal disposed in the vacuum chamber, and a target disposed in the vacuum chamber, characterized in that the target of the apparatus has a portion having a generally uniform thickness, a conical sputtering surface pointing toward the pedestal, and an opposed conical back side, wherein at least a first and a second magnetic pole piece are rotatably disposed adjacent to the conical backside, the first and second pole pieces forming a relatively uniform gap therebetween and extending about the conical backside surface in a continuous path.

25. The apparatus of claim 24, wherein said first pole piece forms a north magnetic pole.

26. The apparatus of claim 24, wherein the target further includes a reference centerline extending through the center of the target, and the path extends circumferentially about the centerline at different distances from the center of the target at different arcuate locations about said centerline.

27. The apparatus of claim 26, wherein the gap extends from a radial position outward of the center of the target to a position inwardly of the edge of the target.

28. The apparatus of claim 24, wherein said backside is a conical surface extending from a circumferential maximum to a radial minimum in a continuous path, and the gap extends in a continuous circumferential path about the backside of the target.

29. The apparatus of claim 28, wherein the gap exists at different distances from the radial minimum at different arcuate locations from the radial minimum of the target.

30. The apparatus of claim 24, wherein the convex sputtering surface terminates in a planar face.

31. The apparatus of claim 24, wherein the pole pieces are moved with respect to the target backside.

32. The apparatus of claim 31, wherein the target includes a centerline extending through the target generally through the conical center of the conical sputtering surface, the gap defined by the pole pieces is disposed at different distances from the intersection of the centerline with the target backside, and the pole pieces are rotated about the centerline.

33. The apparatus of claim 24, wherein said conical surface terminates in a planar surface.

34. A sputtering apparatus comprising a vacuum chamber, a pedestal disposed in the vacuum chamber, a generally planar substrate receiving surface, and a target disposed in the vacuum chamber, characterized in that the target has a generally conical sputtering surface pointing toward the pedestal wherein substantially all of the conical sputtering surface disposed above said substrate receiving surface is located askew to the substrate receiving surface and the angle formed between the conical sputtering surface and the centerline of the conical surface is between about 35 and about 65 degrees and substantially equal to the angle between the sputtering surface and a sputter maximum of a sputtered particle distribution.

* * * * *

UNITED STATES PATENT AND TRADEMARK OFFICE
CERTIFICATE OF CORRECTION

PATENT NO. : 5,919,345

DATED : July 6, 1999

INVENTOR(S) : Avi Tepman

It is certified that error appears in the above-identified patent and that said Letters Patent is hereby corrected as shown below:

Column 1, line 32, change "that" to --than--.

Column 5, line 2, change "40" to --32--.

Column 5, line 5, change "34" to --32--.

Column 5, line 38, change "40" to --32--.

Column 5, line 45, change "38" to --32--.

Column 6, line 46, change "a-f" to --a-h--.

Column 6, line 53, change "a-g" to --a-h--.

Column 6, line 61, change "76, 78" to --74, 76--.

Column 6, line 66, change "76, 78" to --74, 76--.

UNITED STATES PATENT AND TRADEMARK OFFICE
CERTIFICATE OF CORRECTION

PATENT NO. : 5,919,345

DATED : July 6, 1999

INVENTOR(S) : Avi Tepman

It is certified that error appears in the above-identified patent and that said Letters Patent is hereby corrected as shown below:

Column 6, line 62, change "74" to --65--.

Column 6, line 63, change "74" to --65--.

Column 6, line 62, change "70" to --80--.

Column 7, line 3, change "76, 78" to --74, 76--.

Column 7, line 4, change "76, 78" to --74, 76--.

Column 7, line 7, change "76, 78" to --74, 76--.

Column 7, line 8, change "76, 78" to --74, 76--.

Column 7, line 10, change "76, 78" to --74, 76--.

UNITED STATES PATENT AND TRADEMARK OFFICE
CERTIFICATE OF CORRECTION

PATENT NO. : 5,919,345

DATED : July 6, 1999

INVENTOR(S) : Avi Tepman

It is certified that error appears in the above-identified patent and that said Letters Patent is hereby corrected as shown below:

Column 7, line 15, change "42" to --32--.

Column 7, line 20, change "42" to --32--.

Signed and Sealed this

Fifth Day of October, 1999

Q. TODD DICKINSON

*Attest:*

*Attesting Officer*

Acting Commissioner of Patents and Trademarks